United States Patent
Umeda et al.

(10) Patent No.: US 12,387,921 B2
(45) Date of Patent: Aug. 12, 2025

(54) APPARATUS DIAGNOSTIC APPARATUS, APPARATUS DIAGNOSTIC METHOD, PLASMA PROCESSING APPARATUS AND SEMICONDUCTOR DEVICE MANUFACTURING SYSTEM

(71) Applicant: Hitachi High-Tech Corporation, Tokyo (JP)

(72) Inventors: Shota Umeda, Tokyo (JP); Masahiro Sumiya, Tokyo (JP); Yoshito Kamaji, Tokyo (JP); Kenji Tamaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/431,516

(22) PCT Filed: Jun. 15, 2020

(86) PCT No.: PCT/JP2020/023386
§ 371 (c)(1),
(2) Date: Aug. 17, 2021

(87) PCT Pub. No.: WO2021/255784
PCT Pub. Date: Dec. 23, 2021

(65) Prior Publication Data
US 2022/0399182 A1 Dec. 15, 2022

(51) Int. Cl.
*H01J 37/32* (2006.01)
(52) U.S. Cl.
CPC .... *H01J 37/3288* (2013.01); *H01J 37/32926* (2013.01); *H01J 37/32935* (2013.01)
(58) Field of Classification Search
CPC ............ H01J 37/3288; H01J 37/32926; H01J 37/32935; Y02P 90/80; G06Q 10/20;
(Continued)

(56) References Cited

U.S. PATENT DOCUMENTS

2005/0146709 A1* 7/2005 Oh .................... H01J 37/32935
356/326
2005/0217794 A1* 10/2005 Kagoshima ....... H01J 37/32935
156/345.24
(Continued)

FOREIGN PATENT DOCUMENTS

JP 2009-003517 A 1/2009
JP 2009124677 A 6/2009
(Continued)

OTHER PUBLICATIONS

Office Action mailed Mar. 20, 2023 in Korean Application No. 10-2021-7016709.
(Continued)

*Primary Examiner* — Ziaul Karim
(74) *Attorney, Agent, or Firm* — Miles & Stockbridge, P.C.

(57) ABSTRACT

In a plasma processing apparatus, occurrence of unplanned maintenance is predicted in advance so that a time when the work should be incorporated into planned maintenance can be determined. An apparatus diagnostic apparatus including a degradation score estimation unit that receives an output of a sensor mounted on a plasma processing apparatus and estimates a degradation score of the plasma processing device; a maintenance work occurrence probability estimation unit that calculates a probability of occurrence of an unplanned maintenance work that is not included in an original maintenance plan based on the degradation score; an actual maintenance cost calculation unit that calculates an actual maintenance cost; and a plan incorporated maintenance cost calculation unit that outputs a correction plan of maintenance plan in which the original maintenance plan is corrected by incorporating the unplanned maintenance work
(Continued)

based on the probability of occurrence of the unplanned maintenance work.

4 Claims, 8 Drawing Sheets

(58) Field of Classification Search
CPC ............. G06Q 10/04; G06Q 10/06393; G06Q 10/067; G06Q 10/06375
See application file for complete search history.

(56) References Cited

U.S. PATENT DOCUMENTS

| | | | |
|---|---|---|---|
| 2006/0047458 A1* | 3/2006 | Benjamin | G05B 19/4184 702/117 |
| 2009/0132321 A1 | 5/2009 | Kamisuwa et al. | |
| 2009/0200461 A1* | 8/2009 | Raj | C23C 14/48 250/287 |
| 2009/0210278 A1 | 8/2009 | Kamisuwa et al. | |
| 2010/0045316 A1* | 2/2010 | Avoyan | H01L 21/6833 324/762.05 |
| 2015/0220847 A1* | 8/2015 | Shibuya | G06N 20/00 706/12 |
| 2018/0047607 A1* | 2/2018 | Busche | H01L 21/67103 |
| 2019/0236556 A1* | 8/2019 | Morisawa | G06Q 10/067 |
| 2019/0295890 A1* | 9/2019 | Clark | H01L 21/7685 |
| 2020/0058081 A1 | 2/2020 | Saneyoshi et al. | |
| 2020/0333777 A1* | 10/2020 | Maruyama | G06N 7/01 |

FOREIGN PATENT DOCUMENTS

| | | |
|---|---|---|
| JP | 2009-217718 A | 9/2009 |
| JP | 2009199596 A | 9/2009 |
| JP | 2015148867 A | 8/2015 |
| JP | 2015-226407 A | 12/2015 |
| JP | 2016057736 A | 4/2016 |
| JP | 2018036939 A | 3/2018 |
| JP | 2019133412 A | 8/2019 |
| JP | 2020034585 A | 3/2020 |
| TW | 201941328 A | 10/2019 |
| WO | 2018061842 A1 | 4/2018 |
| WO | 2018079778 A1 | 5/2018 |

OTHER PUBLICATIONS

Search Report mailed May 17, 2022 in International Application No. PCT/JP2022/011254.
Search Report mailed Sep. 8, 2020 in International Application No. PCT/JP2020/023386.
Office Action mailed Sep. 15, 2021 in Taiwanese Application No. 110121443.

* cited by examiner

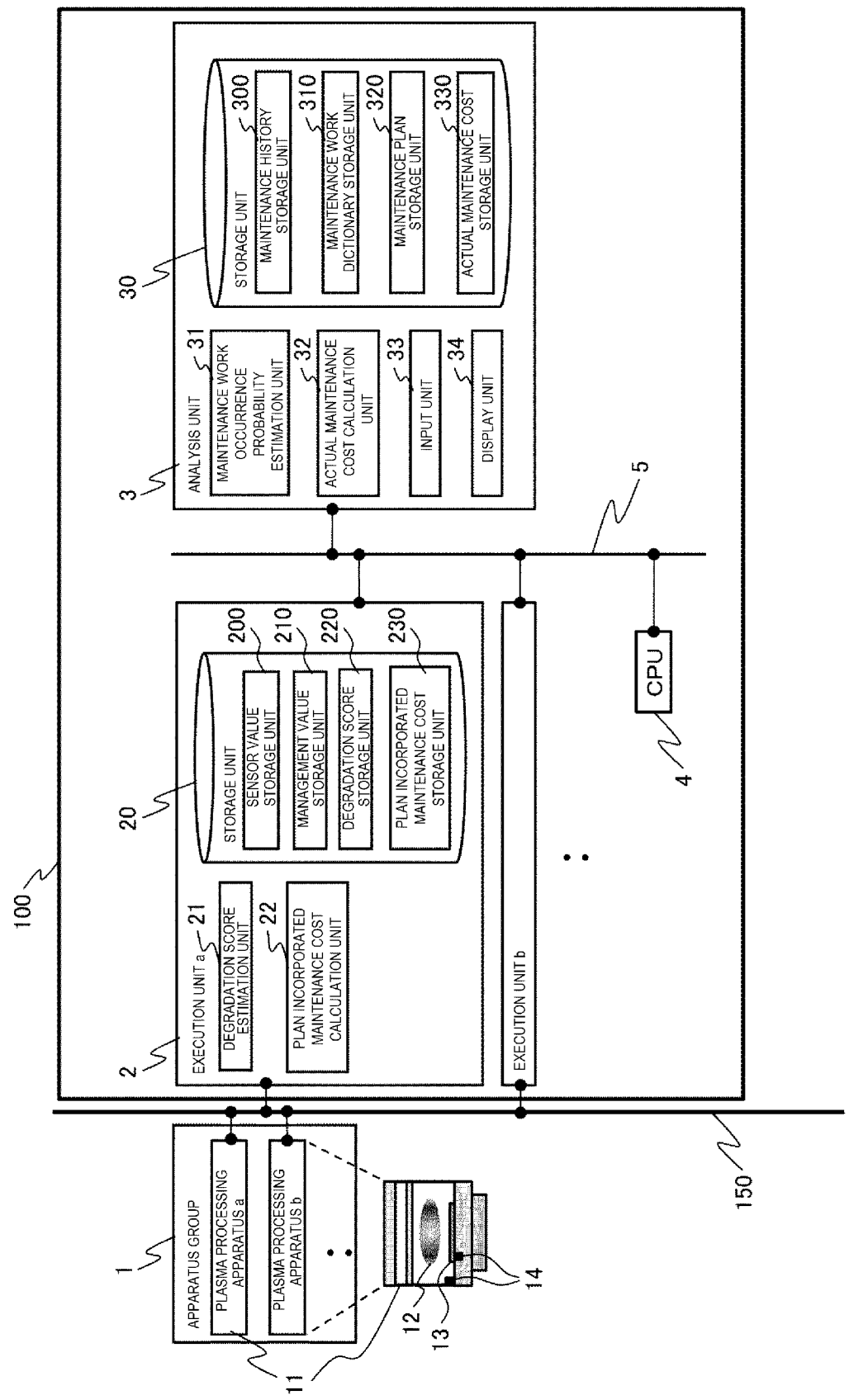
[FIG. 1]

[FIG. 2]

| WAFER ID (206) | PROCESSING CONDITION ID (205) | PROCESSING STEP ID (204) | DATE AND TIME (203) | SENSOR VALUE (202) | | | |
|---|---|---|---|---|---|---|---|
| | | | | X1 | X2 | ... | Xn |
| W1 | R1 | S1 | 2020/3/24 17:31:45 | 102 | 1.02 | ... | 35 |
| | | | ⋮ | ⋮ | ⋮ | ⋮ | ⋮ |
| | | ⋮ | ⋮ | ⋮ | ⋮ | ⋮ | ⋮ |
| ⋮ | ⋮ | ⋮ | ⋮ | ⋮ | ⋮ | ⋮ | ⋮ |

| WAFER ID (226) | PROCESSING CONDITION ID (225) | PROCESSING STEP ID (224) | DATE AND TIME (223) | DEGRADATION SCORE (DEGRADATION SCORE ESTIMATION MODEL ID) (222) | | | |
|---|---|---|---|---|---|---|---|
| | | | | M1 | M2 | ... | Mn |
| W1 | R1 | S1 | 2020/3/24 17:31:45 | 0.01 | 0.03 | ... | 0.02 |
| | | | ⋮ | ⋮ | ⋮ | ⋮ | ⋮ |
| | | ⋮ | ⋮ | ⋮ | ⋮ | ⋮ | ⋮ |
| ⋮ | ⋮ | ⋮ | ⋮ | ⋮ | ⋮ | ⋮ | ⋮ |

221

[FIG. 4]
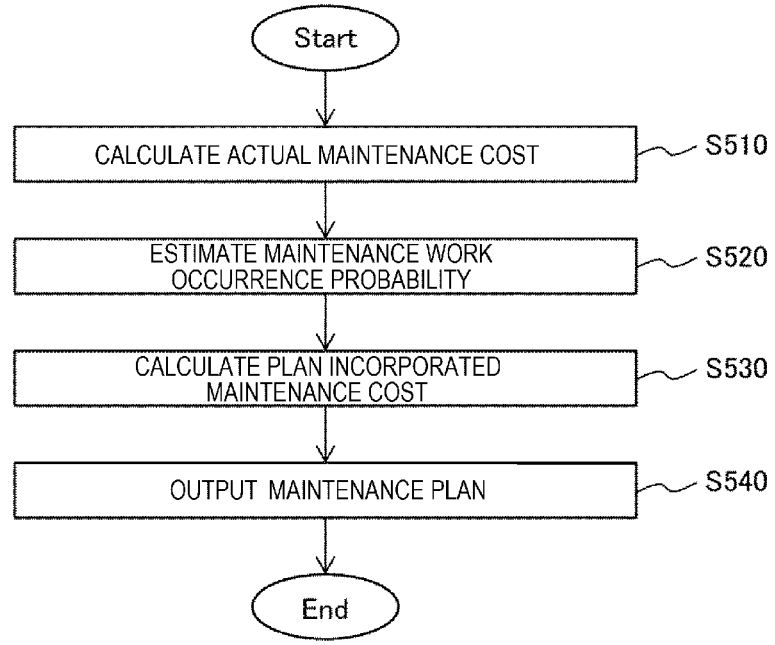
| WORK ID | APPARATUS ID | DATE AND TIME | NON-OPERATION TIME (hr) | WORK CLASSIFICATION | WORK CONTENT |
|---|---|---|---|---|---|
| MW1 | C1 | 2020/3/23 08:05 | 0.7 | PLAN | Replace o-ring. ··· |
| ··· | ··· | ··· | ··· | ··· | ··· |
[FIG. 5]
```
         Start
           ↓
 CALCULATE ACTUAL MAINTENANCE COST         — S510
           ↓
 ESTIMATE MAINTENANCE WORK
 OCCURRENCE PROBABILITY                    — S520
           ↓
 CALCULATE PLAN INCORPORATED
 MAINTENANCE COST                          — S530
           ↓
 OUTPUT MAINTENANCE PLAN                   — S540
           ↓
          End
```

[FIG. 6]
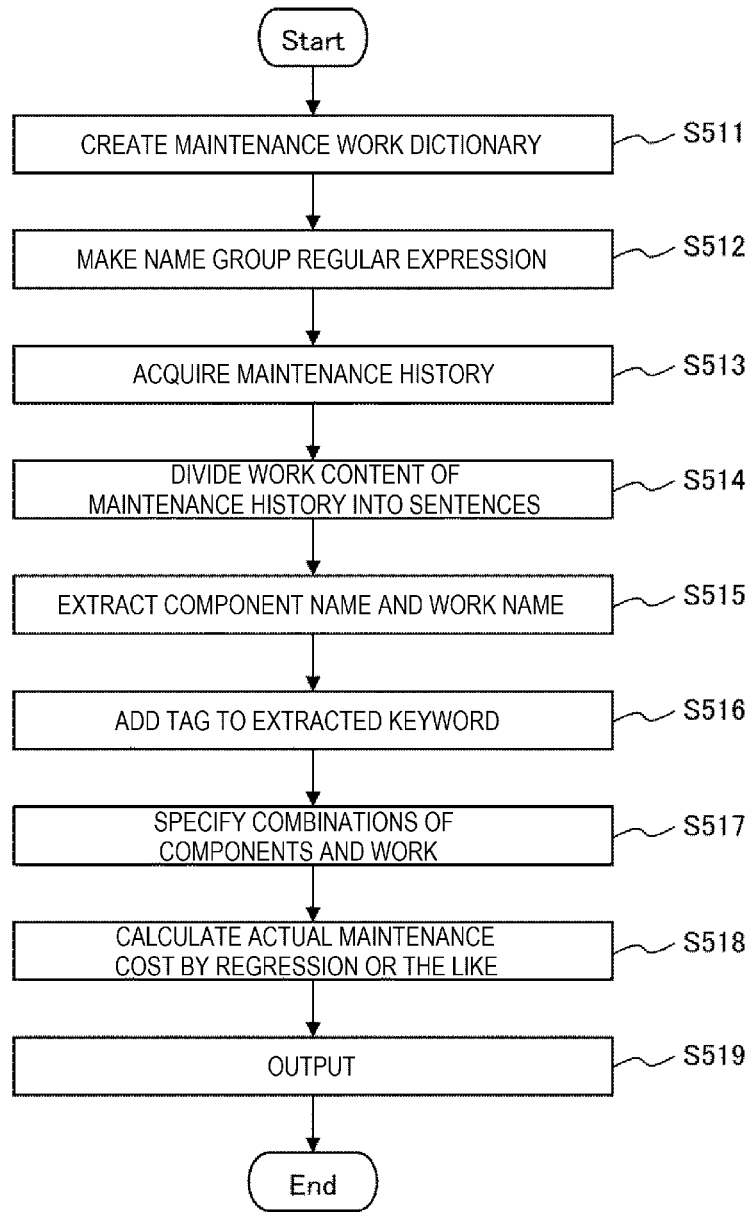

[FIG. 7]
311
| 312 | COMPONENT ID | CP1 | CP2 | ... |
|---|---|---|---|---|
| 313 | PART NAME | Exhaust | Exhaust | |
| 314 | COMPONENT NAME | pump A | ... | ... |
| 315 | NAME GROUP | pump A | ... | ... |
| | | pump 1 | ... | ... |
| | | A pump | ... | ... |
[FIG. 8]
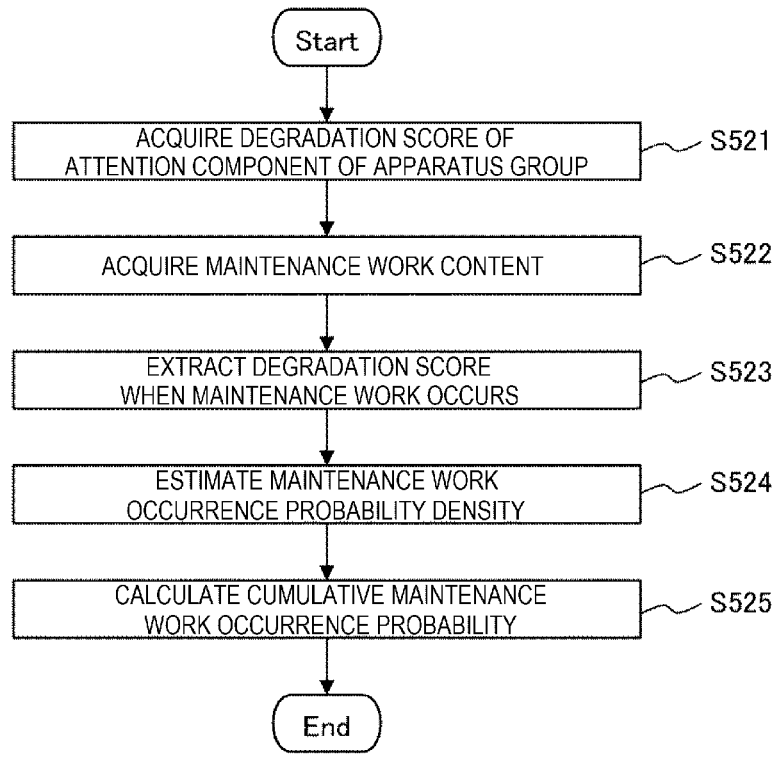

[FIG. 9]
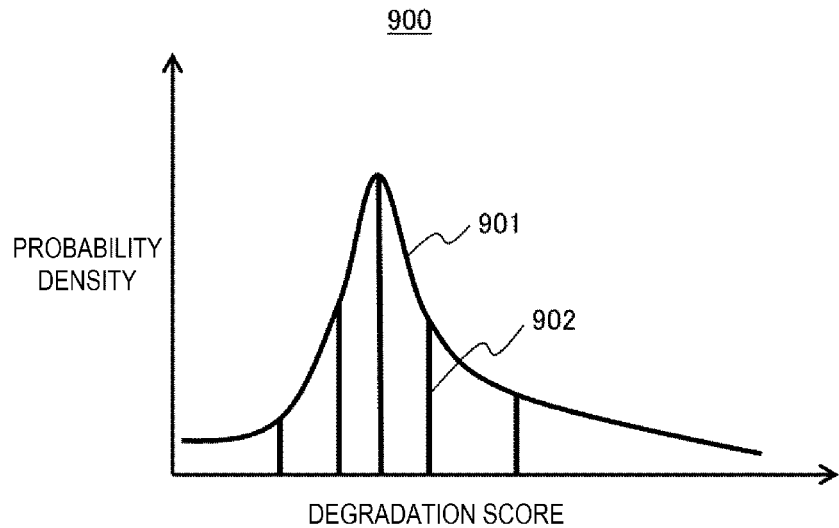
[FIG. 10]
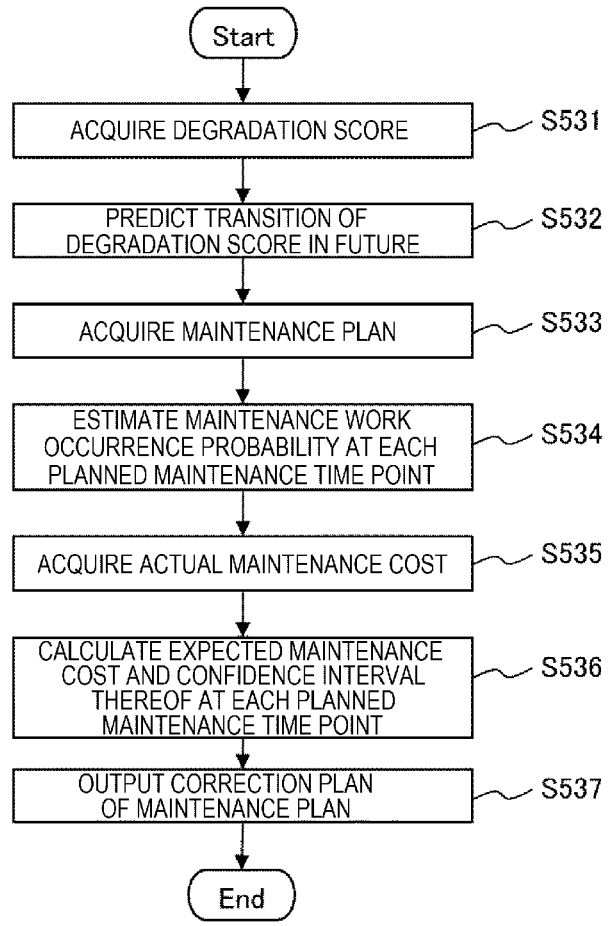

[FIG. 11]
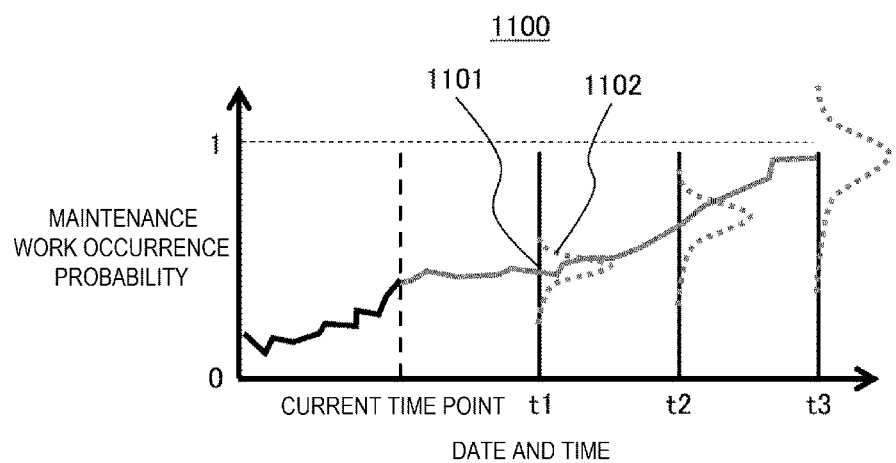
[FIG. 12]
| MAINTENANCE WORK | EXPECTED VALUE AND CONFIDENCE INTERVAL OF MAINTENANCE COST (NON-OPERATION TIME [hr]) | | | |
| --- | --- | --- | --- | --- |
| | t1 | t2 | t3 | ... |
| Replace pump A | +3.0 (2.5~3.5) | +2.3 (1.6~2.9) | +3.5 (2.6~4.4) | ... |
| ... | ... | ... | ... | ... |
| MAINTENANCE COST TYPE | NON-OPERATION TIME ▼ |
| --- | --- |

[FIG. 13]

| PLANNED MAINTENANCE DATE AND TIME | RECOMMENDED ADDITION WORK |
|---|---|
| t1 | ... |
|  | ... |
|  | ... |
| t2 | replace pump A |
|  | ... |
| t3 | ... |
|  | ... |

CORRECTION PLAN OF MAINTENANCE PLAN

| APPARATUS ID | C23 |
|---|---|
| PRIORITY MAINTENANCE COST TYPE | NON-OPERATION TIME (EXPECTED VALUE) |

APPARATUS DIAGNOSTIC APPARATUS, APPARATUS DIAGNOSTIC METHOD, PLASMA PROCESSING APPARATUS AND SEMICONDUCTOR DEVICE MANUFACTURING SYSTEM

TECHNICAL FIELD

The present invention relates to an apparatus diagnostic method and an apparatus diagnostic apparatus for a plasma processing apparatus that processes a semiconductor wafer by plasma.

BACKGROUND ART

A plasma processing apparatus is an apparatus that performs plasma processing in which a substance is turned into plasma and the substance on a wafer is removed by an action of the substance in order to form a fine shape on a semiconductor wafer. In a plasma etching apparatus, maintenance (planned maintenance) such as cleaning the inside of the apparatus and replacement of a component is usually performed according to a maintenance plan established in advance based on the number of wafers to be processed and the like. However, unplanned maintenance work may occur due to deterioration of a component due to a secular change and accumulation or the like of a reaction by-product depending on a method of use. In order to reduce non-operation time (downtime) due to unplanned maintenance, it is necessary to sequentially monitor a deterioration state of components and take early measures such as cleaning and replacement according to the deterioration state.

In order to realize such early measures, in an apparatus diagnostic apparatus, it is common practice to estimate a degradation score based on deviation from a normal state by using sensor values sequentially acquired from a plurality of state sensors attached to the apparatus, and issue an alarm in comparison with a set threshold value. For example, specification of Republished Patent WO 2018-061842 (PTL 1) discloses that "The abnormality detection apparatus applies statistical modeling to a summary value acquired by summarizing the observation values, to estimate a state in which noise is removed from the summary value, and generate a predictive value acquired by predicting a summary value of a next period based on the estimating. The abnormality detection apparatus detects presence/absence of abnormality of the monitoring target apparatus based on the predictive value."

Further, as a diagnostic method after detecting an abnormality, for example, Japanese Patent Application Publication No. 2015-148867 (PTL 2) discloses a method of "creating a classification reference for classifying the phenomenon pattern based on a work keyword included in the maintenance history information", and "creating a diagnosis model for estimating a work keyword suggested to a maintenance worker based on the work keyword and the phenomenon pattern classified."

Further, Japanese Patent Application Publication No. 2019-133412 (PTL 3) discloses a method of calculating maintenance costs in a representative maintenance method by setting a failure probability in advance.

CITATION LIST

Patent Literature

PTL 1: Specification of Republished Patent WO 2018-061842

PTL 2: JP-A-2015-148867

PTL 3: JP-A-2019-133412

SUMMARY OF INVENTION

Technical Problem

PTL 1 discloses a method of detecting presence/absence of an abnormality in an apparatus and issuing an alarm. However, PTL 1 does not disclose providing information on how to specifically correct a maintenance plan after issuing the alarm.

Therefore, the invention provides an apparatus diagnostic apparatus that presents a maintenance plan that also takes into consideration maintenance costs such as an apparatus operation rate and maintenance work costs in addition to a degradation score estimation result using sensor values. In presenting the maintenance plan that also takes into consideration the maintenance costs, there are following two problems.

A first point is to estimate an actual maintenance cost for a component and each work related to the component based on a maintenance history including a free description. From a viewpoint of recording man-hours and the like, the maintenance history is often the free description. From such an unstructured record, it is necessary to specify combinations of a component to be maintained and the work and estimate the actual maintenance cost.

For example, PTL 2 discloses a method of extracting a word representing work from the maintenance history as a keyword and assigning an importance degree to the word. However, there are problems that the combination of a component and a work cannot be specified only by extracting the word as the keyword, and that a case where the same component has a plurality of names cannot be dealt with.

A second point is to calculate a maintenance cost (hereinafter referred to as plan incorporated maintenance cost) when unplanned maintenance is incorporated into planned maintenance at a plurality of time points using the actual maintenance costs, and to present an optimal correction plan of the maintenance plan from the viewpoint of the maintenance costs.

Since the plasma processing apparatus is a vacuum apparatus and it takes time to start up and stop the apparatus, the operation rate may decrease in a method of performing maintenance every time immediately after the alarm is issued. Therefore, an objective is to acquire a maintenance method in which occurrence of the unplanned maintenance is predicted in advance and additional work is incorporated into the planned maintenance set in advance.

For example, PTL 2 discloses a method of classifying a phenomenon pattern based on the sensor values and presenting a work keyword to a maintenance worker. However, it is difficult for the maintenance worker or a maintenance planner to determine when to perform the work.

Further, PTL 3 discloses a method of calculating the maintenance costs in a representative maintenance method by setting a failure probability in advance, but since an etching apparatus takes a long start-up time, if the apparatus is stopped immediately after the alarm is issued from an apparatus monitor only for maintenance corresponding to the alarm, there is a problem that efficiency of apparatus operation is reduced.

The invention solves the above-mentioned problems in the related art and provides an apparatus diagnostic method and an apparatus diagnostic apparatus for a plasma processing apparatus capable of predicting, in advance, occurrence of unplanned maintenance that may occur in the plasma processing apparatus, and allowing a user such as a maintenance planner and a maintenance worker to immediately determine necessary maintenance work and a time point when the work should be incorporated into planned maintenance from a viewpoint of priority maintenance cost.

Solution to Problem

In order to solve the above-mentioned problems, the invention provides an apparatus diagnostic apparatus that diagnoses an apparatus state of a plasma processing apparatus, in which a maintenance plan of the plasma processing apparatus planned in advance is corrected based on a probability of occurrence of an unplanned maintenance work of the plasma processing apparatus and a maintenance cost related to a maintenance work, and the probability is obtained based on a degradation score of the plasma processing apparatus estimated based on a monitored apparatus state of the plasma processing apparatus.

Further, in order to solve the above-mentioned problems, the invention provides a plasma processing apparatus including an apparatus diagnostic apparatus configured to diagnose an apparatus state, in which the apparatus diagnostic apparatus corrects a maintenance plan of the plasma processing apparatus planned in advance based on a probability of occurrence of an unplanned maintenance work of the plasma processing apparatus and a maintenance cost related to a maintenance work, and the probability is obtained based on a degradation score of the plasma processing apparatus estimated based on a monitored apparatus state of the plasma processing apparatus.

Furthermore, in order to solve the above-mentioned problems, the invention provides a semiconductor apparatus manufacturing system including a platform connected to a plasma processing apparatus via a network and executing apparatus diagnostic processing, in which maintenance plan the apparatus diagnostic processing includes a step of correcting a maintenance plan of the plasma processing apparatus planned in advance based on a probability of occurrence of an unplanned maintenance work of the plasma processing apparatus and a maintenance cost related to an maintenance work, and the probability is obtained based on the degradation score of the plasma processing apparatus estimated based on a monitored apparatus state of the plasma processing apparatus.

In addition, in order to solve the above-mentioned problems, the invention provides an apparatus diagnostic method of diagnosing an apparatus state of a plasma processing apparatus, the apparatus diagnostic method including: correcting a maintenance plan of the plasma processing apparatus planned in advance based on a probability of occurrence of an unplanned maintenance work of the plasma processing apparatus and a maintenance cost related to an maintenance work; and obtaining the probability based on the degradation score of the plasma processing apparatus estimated based on a monitored apparatus state of the plasma processing apparatus.

Advantageous Effect

According to the invention, in the plasma processing apparatus, occurrence of unplanned maintenance that may occur is predicted in advance so that a user such as a maintenance planner and a maintenance worker can immediately determine necessary maintenance work and a time point when the work should be incorporated into planned maintenance from a viewpoint of priority maintenance cost. Problems, configurations, and effects other than the above ones will become apparent from the following description of the embodiments.

BRIEF DESCRIPTION OF DRAWINGS

FIG. 1 is a block diagram showing a configuration of a plasma processing apparatus and an apparatus diagnostic apparatus according to an embodiment.

FIG. 2 is a diagram showing an example of data stored in a sensor value storage unit of the apparatus diagnostic apparatus according to the embodiment in a tabular format.

FIG. 3 is a diagram showing an example of data stored in a degradation score storage unit of the apparatus diagnostic apparatus according to the embodiment in a tabular format.

FIG. 4 is a diagram showing an example of data stored in a maintenance history storage unit of the apparatus diagnostic apparatus according to the embodiment in a tabular format.

FIG. 5 is a flow chart showing a processing flow in an apparatus diagnostic method according to the embodiment.

FIG. 6 is a flow chart showing a processing flow of calculating an actual maintenance cost of the apparatus diagnostic apparatus according to the embodiment.

FIG. 7 is a diagram showing an example of data stored in a maintenance work dictionary storage unit of the apparatus diagnostic apparatus according to the embodiment in a tabular format.

FIG. 8 is a flow chart showing a processing flow of a maintenance work occurrence probability estimation unit of the apparatus diagnostic apparatus according to the embodiment.

FIG. 9 is a graph showing a relationship between a degradation score and a maintenance work occurrence probability density distribution according to the embodiment.

FIG. 10 is a flow chart showing a processing flow of a plan incorporated maintenance cost calculation unit of the apparatus diagnostic apparatus according to the embodiment.

FIG. 11 is a graph showing an example of an estimation result of a maintenance work occurrence probability at each planned maintenance time point according to the embodiment.

FIG. 12 is a diagram showing an example of data stored in a plan incorporated maintenance cost storage unit of the apparatus diagnostic apparatus according to the embodiment in a tabular format.

FIG. 13 is a diagram showing an example of a screen displaying a correction plan of maintenance plan of the apparatus diagnostic apparatus according to the embodiment.

DESCRIPTION OF EMBODIMENTS

The invention provides an apparatus diagnostic method and an apparatus diagnostic apparatus for a plasma processing apparatus that estimate a maintenance cost when an additional work (unplanned maintenance work not included in an original maintenance plan) is incorporated into a maintenance plan based on sensor data, a maintenance history, and the original maintenance plan, and output a correction plan of maintenance plan in which the estimated maintenance cost is minimized.

The invention provides an apparatus diagnostic method and an apparatus diagnostic apparatus that output the additional work with a minimized estimated maintenance cost at a plurality of planned maintenance time points as the correction plan of maintenance plan from the sensor data, the maintenance history, and the maintenance plan of an apparatus group.

In addition, in the invention, the maintenance work, which is combinations of each component and work performed at each maintenance ID is specified from the maintenance history including a free description of the plasma processing apparatus, an actual maintenance cost for each maintenance work based on maintenance cost information such as an apparatus operation rate is calculated, a degradation score of each component is estimated by using a management value such as sensor values and sample processing numbers sequentially acquired by the plasma processing apparatus, a maintenance work occurrence probability until a certain degradation score is reached is estimated based on probability distribution of the degradation score of a plasma processing apparatus group when each maintenance work occurs, transition of a degradation score from the degradation score estimated sequentially is predicted at the time of apparatus diagnostic, and a maintenance cost when the additional maintenance work is incorporated into the planned maintenance at a plurality of time points is calculated based on the actual maintenance cost and the maintenance work occurrence probability for presentation.

The apparatus diagnostic apparatus according to the invention has following three configurations.

(1) Maintenance work occurrence probability estimation unit: estimating a probability of occurrence of each maintenance work at a certain time point from the distribution of a degradation score of a component estimated using sensor data of a model construction unit.

(2) Actual maintenance cost calculation unit: specifying a maintenance work of each maintenance ID (combinations of components and works) from a maintenance work dictionary describing a maintenance history including a free description and keywords of the components and works including various expressions, and calculating an actual maintenance cost of each maintenance work together with apparatus operation rate data.

(3) Plan incorporated maintenance cost calculation unit: calculating an expected maintenance cost and a confidence interval thereof when a necessary additional work is incorporated in the plan maintenance at a plurality of time points from outputs of the above (1) and (2) and the original maintenance plan, and outputting a correction plan of maintenance plan such that a specified maintenance cost type (an operation time, a work cost, and the like) becomes the minimum.

Hereinafter, embodiments of the invention will be described with reference to the drawings. The same components are denoted by the same reference numerals in principle in all the drawings for describing the embodiments, and repeated description is omitted.

EMBODIMENT

FIG. 1 shows a configuration of an apparatus diagnostic apparatus 100 according to the present embodiment. The apparatus diagnostic apparatus 100 according to the present embodiment is connected to an apparatus group 1 including each plasma processing apparatus 11 via a communication line 150. The apparatus diagnostic apparatus 100 includes an execution unit 2, an analysis unit 3, and a central processing unit (CPU) 4, which are connected to each other via an internal bus 5. The apparatus diagnostic apparatus 100 may be connected to an external control apparatus or storage apparatus via the communication line 150.

Each configuration shown in FIG. 1 will be described below.

(1) Plasma Processing Apparatus 11

In a configuration diagram shown in FIG. 1, each plasma processing apparatus 11 constituting the apparatus group 1 processes a sample 13 by generating plasma 12 in accordance with set processing conditions. In the plasma processing apparatus 11, a state sensor group 14 (for example, a temperature sensor and a pressure sensor) is mounted, and a measurement value of a sensor value (for example, temperature and pressure) during processing of the sample 13 with the plasma 12 or during idling when generation of the plasma 12 is stopped can be acquired as time series data. Each plasma processing apparatus 11 constituting the apparatus group 1 includes, for example, a plasma etching apparatus.

(2) Apparatus Diagnostic Apparatus 100

As shown in the configuration diagram of FIG. 1, the apparatus diagnostic apparatus 100 includes: the execution unit 2 that receives a sensor signal from the state sensor group 14 mounted on each plasma processing apparatus 11 of the apparatus group 1 and executes processing, the analysis unit 3 that performs analysis on the plasma processing apparatus 11, and the CPU 4 that controls operations of the execution unit 2 and the analysis unit 3, which are connected to each other via the internal bus 5. In addition, the apparatus diagnostic apparatus 100 is connected to each plasma processing apparatus 11 through the communication line 150, and the execution unit 2 acquires data from the state sensor group 14 from each plasma processing apparatus 11 via the communication line 150.

The execution unit 2 includes a storage unit 20, a degradation score estimation unit 21, and a plan incorporated maintenance cost calculation unit 22. Further, the storage unit 20 includes a sensor value storage unit 200, a management value storage unit 210, a degradation score storage unit 220, and a plan incorporated maintenance cost storage unit 230.

The analysis unit 3 includes a storage unit 30, a maintenance work occurrence probability estimation unit 31, an actual maintenance cost calculation unit 32, an input unit 33, and a display unit 34. Further, the storage unit 30 includes a maintenance history storage unit 300, a maintenance work dictionary storage unit 310, a maintenance plan storage unit 320, and an actual maintenance cost storage unit 330.

The sensor value storage unit 200 in the storage unit 20 of the execution unit 2 stores a sensor value (measurement value) acquired from the state sensor group 14 of the plasma processing apparatus 11 via the communication line 150.

FIG. 2 is a diagram showing an example of processing data 201 stored in the sensor value storage unit 200 in a tabular format. A measurement value of the sensor value 202 is stored as time-series data 203 for each sensor constituting the state sensor group 14 mounted on the plasma processing apparatus 11. When the sample 13 is being processed by generating the plasma 12 in the plasma processing apparatus 11, a processing step ID: 204 is attached and stored for each set processing step. In addition, along with the sensor value 202, information specifying processing such as a wafer ID: 206 and a processing condition ID: 205 is stored in association with each other.

The management value storage unit 210 stores a management value such as processing date and time of processing the sample 13 by the plasma processing apparatus 11, processing conditions of the sample 13 by the plasma processing apparatus 11 (input power for generating the plasma 12, a processing time by the plasma 12, pressure during processing, a temperature of the sample 13 being processed, and the like), the number of processed samples 13, and the like.

The degradation score estimation unit 21 uses a degradation score estimation model constructed by learning in advance for each component which is a monitoring target of each plasma processing apparatus 11 to estimate and output a degradation score of each component corresponding to each degradation score estimation model ID by using the sensor value 202 sequentially acquired from the sensor value storage unit 200 as an input.

FIG. 3 shows an example of data 221 stored in the degradation score storage unit 220 in a tabular format. The data 221 stored in the degradation score storage unit 220 includes a degradation score 222 of the output for each degradation score estimation model ID, information for specifying the processing (time series data 223, a wafer ID: 226, a processing condition ID: 225, a processing step ID: 224), and the like.

The plan incorporated maintenance cost calculation unit 22 of FIG. 1 predicts the transition of the degradation score 222 of each component corresponding to each degradation score estimation model ID in the future from the transition of the degradation score 222 up to the current time point in the data 221 stored in the degradation score storage unit 220, estimates a probability of occurrence of an unplanned maintenance work at a planned maintenance time point in the future based on the output of the maintenance work occurrence probability estimation unit 31, and calculates an expected maintenance cost (an expected value of the maintenance cost) when the unplanned maintenance work is incorporated as an additional work in the future planned maintenance by using information of the actual maintenance cost storage unit 330. A calculated result is stored in the plan incorporated maintenance cost storage unit 230.

As shown in an example of data 301 stored in the maintenance history storage unit 300 of FIG. 4, the maintenance history storage unit 300 in the storage unit 30 of the analysis unit 3 stores a work content 307 of each work ID 302 (one planned maintenance or unplanned maintenance) by the free description. An apparatus ID 303, date and time 304, non-operation time 305, work classification 306, and the like are also stored for use when calculating an actual maintenance cost.

The maintenance work dictionary storage unit 310 stores information for extracting a keyword of a component and a work when a combination of the component and the work is specified from a work content of the maintenance history in the actual maintenance cost calculation unit 32.

The maintenance plan storage unit 320 stores a time (date and time, the number of wafers to be processed, and the like) and a work content of a planned maintenance set in advance by a maintenance planner.

The maintenance work occurrence probability estimation unit 31 acquires a degradation score at the time of occurrence of each maintenance work from degradation scores of each plasma processing apparatus 11 of the apparatus group 1 stored in the degradation score storage unit 220, estimates a maintenance work occurrence probability density according to the degradation score using the acquired degradation score, performs integration processing for the degradation score, and calculates a probability of occurrence of an unplanned maintenance work until a certain degradation score is reached (lower-tail maintenance work occurrence probability).

The actual maintenance cost calculation unit 32 specifies a combination of a component and a work using information of the maintenance work dictionary storage unit 310 from the work content stored in the maintenance history storage unit 300. The actual maintenance cost calculation unit 32 further calculates an actual maintenance cost of each combination by associating the maintenance cost information such as the apparatus operation rate with each combination, and stores the result in the actual maintenance cost storage unit 330.

The input unit 33 is, for example, an input apparatus such as a mouse or a keyboard that receives an information input by user operation.

The display unit 34 is, for example, a display, a printer, or the like, and is an apparatus that graphically outputs information to the user based on information stored in the storage unit 20 of the execution unit 2 and the storage unit 30 of the analysis unit 3, and a final correction plan of maintenance plan output from the plan incorporated maintenance cost calculation unit 22 of the execution unit 2.

(3) Method of Creating Correction Plan of Maintenance Plan

A method of creating a correction plan of maintenance plan in which an unplanned maintenance work that is not included in the maintenance plan is incorporated into a maintenance work included in a maintenance plan created in advance for each plasma processing apparatus 11 constituting the apparatus group 1 using the apparatus diagnostic apparatus 100 described above will be described with reference to FIG. 5.

In order to create the correction plan of maintenance plan in which the unplanned maintenance work is incorporated into the maintenance plan of each plasma processing apparatus 11 constituting the apparatus group 1, in the apparatus diagnostic apparatus 100, first, an actual maintenance cost is calculated in the actual maintenance cost calculation unit 32 (S510). Next, a maintenance work occurrence probability of the unplanned maintenance is estimated in the maintenance work occurrence probability estimation unit 31 (S520).

Next, a plan incorporated maintenance cost is calculated in the plan incorporated maintenance cost calculation unit 22 using data of the actual maintenance cost calculated in S510 and the maintenance work occurrence probability obtained in S520 (S530), and a correction plan of maintenance plan is outputted to the display unit 34 (S540).

The details of each step will be described below.

(3-1) Calculate Actual Maintenance Cost: S510

With reference to FIG. 6, an example of a process of specifying a combination of each maintenance work and a component from a maintenance history and calculating an actual maintenance cost such as an apparatus operation rate for each maintenance work performed by the actual maintenance cost calculation unit 32 of the apparatus diagnostic apparatus 100 will be described.

As advance preparation, a maintenance work dictionary defining a name group of each component and work is created based on knowledge of the apparatus in advance, and is stored in the maintenance work dictionary storage unit 310 (S511). As in an example of a maintenance work dictionary 311 for components shown in FIG. 7, a component name 314 and a name group 315 corresponding to each component ID 312 and part name 313 are specified.

When a keyword is extracted from the maintenance history stored in the maintenance history storage unit 300, the keyword described in the name group 315 stored in the maintenance work dictionary storage unit 310 is extracted as a component described in the component name 314. By adopting such an extraction method, it is possible to deal with a case where one component has various names. In addition, by describing the part name 313 together, it is possible to extract problems such as a high frequency of occurring maintenance work around a certain part. A maintenance work dictionary related to a work is also created in the same manner.

Next, the name group 315 is made into a regular expression in order to deal with a fluctuation of general words (S512). The fluctuation of general words includes the presence or absence of a space, singular and plural forms, endings, or the like. In order to extract the keyword even if there is such a fluctuation, for example, in a case of "o ring" formed of an elastic member having a circular cross section for sealing a connection portion of a vacuum apparatus, it is described in a regular expression such as "o[-] rings?". The regular expression for such a standard word fluctuation can be easily automated.

Next, a maintenance history for a specified period is acquired from the maintenance history storage unit 300 (S513), and a work content of the maintenance history is divided into sentences (S514). A keyword matching the regular expression described in the name group is extracted from each sentence, and the extracted keyword is associated with the component name or the part name to which the name group belongs (S515).

Then, a tag is added to a phrase in a sentence in order to specify a combination of a component and a work (S516). A component tag is attached to a phrase extracted as a component, a work tag is attached to a phrase extracted as a work, and a tag indicating a part of speech is attached to other words. The combination is specified by using the attached tags and extracting the combination of the component and the work matching a tag order defined in one sentence (S517).

The specified tag order is not limited to a specific tag order as long as the combination of the component and the work is correctly specified. For example, for a work content such as " . . . replace o ring and pump A . . . ", o ring and pump A are tagged with a component tag (<CMP>), replace is tagged with a work tag (<WORK>), and "and" is tagged with a coordinate conjunction tag (<AND>); and by specifying the tag order with the regular expression such as "<WORK>(<AND>*<WORK>)*<CMP> (<AND>*<CMP>)", a combination of "replace o ring" and "replace pump A" can be extracted correctly.

Next, an actual maintenance cost for each combination of the component and the work is calculated (S518). For example, when the apparatus operation rate or the non-operation time 305 for each work ID 302 stored in the maintenance history storage unit 300 is used as the maintenance cost information, regression in which appearance/non-appearance of each combination in each work ID 302 is used as an explanatory variable as a dummy variable and the maintenance cost information is used as an objective variable is performed, and the actual maintenance cost for each combination is calculated.

Finally, the calculated actual maintenance cost of each of the combinations of the components and the works is output to the actual maintenance cost storage unit (S519).

Since the actual maintenance costs calculated as described above may change when the period is free, the actual maintenance costs are updated periodically or at any time point.

(3-2) Estimate Maintenance Work Occurrence Probability: S520

When a maintenance work occurrence probability corresponding to a degradation score is estimated in the maintenance work occurrence probability estimation unit 31, the degradation score estimation unit 21 accumulates degradation scores related to an attention component of each plasma processing apparatus 11 of the apparatus group 1.

The degradation score estimation unit 21 sequentially acquires sensor values during processing or idling of the sample 13 by the plasma processing apparatus 11 from the sensor value storage unit 200 by using a degradation score estimation model of each registered component, estimates a degradation score, and outputs the estimated degradation score to the degradation score storage unit 220. The degradation score estimation model may use a method suitable for estimation of deterioration of each component, and the method is not specifically limited.

For example, in a case where it is expected that the sensor values follow normal distribution, parameters of the normal distribution may be learned using sensor values in a certain period immediately after the replacement of the components at the time of learning of the degradation score estimation model, and when estimating a degradation score, the degradation score may be estimated based on a Kullback-Leibler distance or log-likelihood with the distribution at the time of learning.

When normality is not expected, the degradation score may be estimated by a method capable of dealing with non-normal distribution such as a k-nearest neighbor algorithm. In addition, in order to reduce observation noise, a value obtained by calculating a statistic such as an average value for each processing step with respect to the sensor values may be used as an input.

FIG. 8 shows an example of processing by the maintenance work occurrence probability estimation unit 31 when estimating a maintenance work occurrence probability. A processing flow chart shown in FIG. 8 corresponds to the above-mentioned step of estimating the degradation score, and the above-mentioned learning of the degradation score estimation model is performed in advance of this step.

First, a degradation score related to a target component of the plasma processing apparatus 11 is acquired from the degradation score storage unit 220 (S521). In addition, occurrence date and time of a maintenance work content related to the target component is acquired from the maintenance history storage unit 300 (S522). Further, a degradation score at a time point when the maintenance work occurs is extracted by using the acquired data (S523). Next, a distribution of the degradation scores at the time of occurrence of the extracted maintenance work (the maintenance work occurrence probability density according to the degradation score) is estimated (S524).

Graph 900 in FIG. 9 shows an example of probability density distribution 901 estimated from degradation score distribution 902 when a maintenance work occurs. A horizontal axis of the graph in FIG. 9 represents the degradation score, and a vertical axis represents the probability density. A distribution estimation method is not limited to a specific method, but for example, a Markov chain Monte Carlo method (MCMC) or a kernel density estimation method may be used.

Finally, the maintenance work occurrence probability density estimated in S524 is subjected to integration processing with respect to the degradation score, and the lower-tail maintenance work occurrence probability (a probability of occurrence of the maintenance work until a certain degradation score is reached) is calculated (S525).

According to the above estimation method of the maintenance work occurrence probability, even when a method of constructing the degradation score estimation model is different for each component, the maintenance work occurrence probability can be calculated by a common method.

(3-3) Calculate Plan Incorporated Maintenance Cost: S530

An example of the processing by the plan incorporated maintenance cost calculation unit 22 of outputting a correction plan of maintenance plan in consideration of the maintenance cost and using the degradation scores sequentially estimated by the degradation score estimation unit 21 and the lower-tail maintenance work occurrence probability calculated by the maintenance work occurrence probability estimation unit 31 is described with reference to FIG. 10.

First, the degradation scores from the maintenance work to a calculation time point that are related to the attention component of a target plasma processing apparatus 11 are acquired from the degradation score storage unit 220 (S531). Further, a transition of the degradation score in the future is predicted from the transition of the degradation score until the calculation time point (S532). At this time, a confidence interval of the prediction is also calculated. The present prediction method is not particularly limited, but for example, an autoregressive model which is a time series prediction method may be used.

Next, as a maintenance plan, a date and time and a work content of a planned maintenance of the target plasma processing apparatus 11 in the future are acquired from the maintenance plan storage unit 320 (S533). Further, based on the predictive value of the degradation score and the confidence interval thereof at a planned maintenance time point in the future, and the lower-tail maintenance work occurrence probability calculated by the maintenance work occurrence probability estimation unit 31, as shown in the graph 110 of FIG. 11, an estimated value 1101 of the maintenance work occurrence probability and a confidence interval 1102 thereof at the planned maintenance time point in the future (time points t1, t2, and t3 in a graph 1100 of FIG. 11) are calculated (S534).

Next, an actual maintenance cost related to an attention maintenance work is acquired from the actual maintenance cost storage unit 330 (S535). Further, based on the estimated value of the maintenance work occurrence probability and the confidence interval thereof calculated in S534, and the actual maintenance cost acquired in S535, an expected maintenance cost and a confidence interval thereof at each planned maintenance time point are calculated (S536).

For example, when a non-operation time is selected as the maintenance cost and the additional work is performed at the time point t1 in FIG. 11, the expected value of the maintenance cost can be calculated by (a probability that the maintenance work occurs up to t1)×(an actual maintenance cost when an unplanned maintenance is performed)+(a probability that the maintenance work does not occur up to t1)×(an actual maintenance cost when a planned maintenance is performed).

A calculated result is stored in the plan incorporated maintenance cost storage unit 230. As shown in an example of data 231 stored in the plan incorporated maintenance cost storage unit 230 of FIG. 12, the calculated result is stored as an expected value and a confidence interval of maintenance costs 233 when each maintenance work 232 is incorporated at each planned maintenance time point. The example shown in FIG. 12 shows an example in which a non-operation time is selected as a maintenance cost type 234.

The above processing is executed on the degradation score estimation model of each component, and the final correction plan of maintenance plan in which an unplanned maintenance work that is not included in the original maintenance plan is incorporated is output and displayed on the display unit 34 (S537).

FIG. 13 shows an example of a display screen 341 of a correction plan of maintenance plan. When an apparatus ID 342 is selected and a priority maintenance cost type 343 is selected, recommended addition work 345 at each planned maintenance date and time 344 when the selected maintenance cost is minimized is displayed in a list. Accordingly, a user can immediately determine an unplanned yet necessary maintenance work that is not included in the original maintenance plan and a time point when the work should be incorporated into the planned maintenance from the viewpoint of priority maintenance cost.

As described above, in the present embodiment, the apparatus diagnostic apparatus that diagnoses an apparatus state of a plasma processing apparatus is configured to include: the degradation score estimation unit configured to receive an output of a sensor that is mounted on the plasma processing apparatus and monitors the apparatus state of the plasma processing apparatus and estimate a degradation score of the plasma processing apparatus; the maintenance work occurrence probability estimation unit configured to calculate a probability of occurrence of an unplanned maintenance work that is not included in an original maintenance plan of the plasma processing apparatus before the plasma processing apparatus reaches a certain degradation score based on the degradation score of the plasma processing apparatus estimated by the degradation score estimation unit; the actual maintenance cost calculation unit configured to calculate an actual maintenance cost of the plasma processing apparatus; and the plan incorporated maintenance cost calculation unit configured to output a correction plan of maintenance plan in which the original maintenance plan of the plasma processing apparatus is corrected by incorporating the unplanned maintenance work based on the probability of occurrence of the unplanned maintenance work of the plasma processing apparatus estimated by the maintenance work occurrence probability estimation unit and the actual maintenance cost of the plasma processing apparatus calculated by the actual maintenance cost calculation unit.

In addition, in the present embodiment, in the apparatus diagnostic method of diagnosing an apparatus state of a plasma processing apparatus using an apparatus diagnostic apparatus, a combination of a each maintenance work and a component in a maintenance history is specified from a maintenance history of the plasma processing apparatus and an actual maintenance cost such as an apparatus operation rate of the plasma processing apparatus for each maintenance work is calculated by the actual maintenance cost calculation unit of the apparatus diagnostic apparatus; the maintenance work occurrence probability of occurrence of the unplanned maintenance work of the plasma processing apparatus is estimated by the maintenance work occurrence probability estimation unit of the apparatus diagnostic apparatus from the degradation score of the plasma processing apparatus obtained by receiving the output of the sensor that monitors the apparatus state of the plasma processing apparatus mounted on the plasma processing apparatus; the correction plan of maintenance plan in which the original maintenance plan of the plasma processing apparatus is corrected by incorporating the unplanned maintenance work by the plan incorporated maintenance cost calculation unit of the apparatus diagnostic apparatus based on the maintenance work occurrence probability of occurrence of the unplanned maintenance work of the plasma processing apparatus estimated by the maintenance work occurrence probability estimation unit and the actual maintenance costs of the plasma processing apparatus calculated by the actual maintenance cost calculation unit; and the correction plan of maintenance plan created by the plan incorporated maintenance cost calculation unit is output from the output unit of the apparatus diagnostic apparatus.

According to the present embodiment, in the plasma processing apparatus 11, the occurrence of an unplanned maintenance that may occur is predicted in advance so that a user such as a maintenance planner and a maintenance worker can immediately determine a necessary maintenance work and a time point when the work should be incorporated into the planned maintenance from the viewpoint of the priority maintenance cost.

In the above-mentioned example, the example is described in which the recommended addition work 345 at each plan maintenance date and time 344 when the selected maintenance cost is minimized is displayed in a list, but the present embodiment is not limited thereto, and a plurality of recommended additional work 345 at each plan maintenance date and time 344 when the selected maintenance cost become the second or third smallest may be displayed in a list so that a recommended additional work can be selected from the plurality of recommended additional work 345 indicated.

While the invention made by the inventor has been described in detail based on the embodiment, the invention is not limited to the above-mentioned embodiment, and various modifications can be made without departing from the scope of the invention. For example, the above-mentioned embodiment has been described in detail for easy understanding of the invention, and the invention is not necessarily limited to those including all of the configurations described above.

REFERENCE SIGN LIST 1 apparatus group
2 execution unit of apparatus diagnostic apparatus
3 analysis unit of apparatus diagnostic apparatus
11 plasma processing apparatus
20 storage unit of execution unit
21 degradation score estimation unit
22 plan incorporated maintenance cost calculation unit
30 storage unit of analysis unit
31 maintenance work occurrence probability estimation unit
32 actual maintenance cost calculation unit
33 input unit
34 display unit
100 apparatus diagnostic apparatus

The invention claimed is:

1. A diagnostic apparatus that diagnoses an apparatus state of a plasma processing apparatus, comprising:
a processor connected to each of a plurality of plasma processing apparatuses via a communication line and configured to execute programmed instructions which cause the processor to perform operations of a plurality of diagnostic execution portions each associated with a corresponding one of the plurality of plasma processing apparatuses, and an analysis portion coupled to the plurality of diagnostic execution portions;
a plurality of sensor groups each mounted on one of the plasma processing apparatuses and configured to output a sensor measurement value; and
a memory configured to store a plurality of the sensor measurement values and the programmed instructions, wherein
the processor is further configured to
receive the sensor measurement value from each of the plurality of sensor groups via the communication line;
store each received sensor measurement value in the memory;
correct a maintenance plan of each of the plasma processing apparatuses planned in advance based on a probability of occurrence of an unplanned maintenance work of the plasma processing apparatus and a maintenance cost related to a maintenance work and the stored sensor measurement data of the plasma processing apparatus, wherein the probability is obtained based on a degradation score of the plasma processing apparatus estimated based on a monitored apparatus state of the plasma processing apparatus,
determine a plurality of combinations of a component and a maintenance work for each plasma processing apparatus based on a work content of a maintenance operation history of each plasma processing apparatus,
calculate a first maintenance cost calculation of a maintenance cost for each combination by associating maintenance cost information with each combination of the component and the maintenance work and by calculating an expected maintenance cost and a confidence interval for each of a plurality of planned maintenance time points of the maintenance plan,
update a specified tag order based on the corrected maintenance plan, wherein the tag order specifies the corrected maintenance plan performed at the plasma processing apparatus and comprises a component tag which identifies at least one of the components and a work tag which identifies the maintenance work,
store the corrected maintenance plan using the memory, and
output the corrected maintenance plan to a display,
wherein the maintenance work comprises work content for causing replacement of at least one of the components at the plasma processing apparatus, and
wherein the at least one component comprises an O-ring and a pump.

2. The apparatus diagnostic apparatus according to claim 1, further comprising:
a stored maintenance work dictionary in which, for each combination of the component and the maintenance work for each plasma processing apparatus specified based on the work content of the maintenance operation history of the plasma processing apparatus, information for extracting a keyword of the component or a keyword of the maintenance work is stored.

3. The apparatus diagnostic apparatus according to claim 2, wherein
the maintenance cost information includes an operation rate of the plasma processing apparatus.

4. The apparatus diagnostic apparatus according to claim 3, wherein the processor is further configured to calculate a second maintenance cost for an expected value of a maintenance cost when a maintenance work not previously included in the maintenance plan is incorporated into the maintenance plan using the maintenance cost information.

* * * * *